US009901002B2

(12) United States Patent
Jenkins

(10) Patent No.: US 9,901,002 B2
(45) Date of Patent: Feb. 20, 2018

(54) STRUCTURES HAVING A MOLDED LINER ATTACHED TO A SUBSTRATE

(71) Applicant: Microsoft Technology Licensing, LLC, Redmond, WA (US)

(72) Inventor: Kurt Jenkins, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/052,615

(22) Filed: Feb. 24, 2016

(65) Prior Publication Data

US 2017/0245382 A1   Aug. 24, 2017

(51) Int. Cl.
| | | |
|---|---|---|
| H05K 5/02 | (2006.01) | |
| H05K 5/00 | (2006.01) | |
| G06F 1/16 | (2006.01) | |
| B29C 65/70 | (2006.01) | |
| B29C 45/14 | (2006.01) | |
| B29C 37/00 | (2006.01) | |
| B32B 3/30 | (2006.01) | |
| B29L 31/34 | (2006.01) | |

(52) U.S. Cl.
CPC ....... *H05K 5/0217* (2013.01); *B29C 37/0082* (2013.01); *B29C 45/14311* (2013.01); *B29C 65/70* (2013.01); *B32B 3/30* (2013.01); *G06F 1/16* (2013.01); *H05K 5/00* (2013.01); *H05K 5/0017* (2013.01); *B29C 2045/14327* (2013.01); *B29L 2031/3475* (2013.01)

(58) Field of Classification Search
CPC ... G06F 1/16; G06F 1/18; G06F 1/181; G06F 1/1616; G06F 1/1656; G06F 1/1632; G06F 1/1626; H05K 5/00; H05K 5/0217; H05K 5/0017; B29C 65/20; B29C 65/70; B29C 45/14311; B29C 37/0082; B29C 2045/14327; B23B 3/0082; B23B 3/30; B29L 2031/3475; Y02E 60/12

USPC .......................... 361/679.01, 679.02, 679.55

See application file for complete search history.

(56) References Cited

U.S. PATENT DOCUMENTS

| 4,315,050 A | 2/1982 | Rourke |
|---|---|---|
| 4,752,498 A | 6/1988 | Fudim |

(Continued)

FOREIGN PATENT DOCUMENTS

| CN | 101927346 A | 12/2010 |
|---|---|---|
| CN | 102407332 A | 4/2012 |

(Continued)

OTHER PUBLICATIONS

Belter, et al., "Strengthening of 3D Printed Fused Deposition Manufactured Parts Using the Fill Compositing Technique", In Journal of PLOS One, vol. 10, Issue 4, Apr. 16, 2015, pp. 1-19.

(Continued)

*Primary Examiner* — Anthony Haughton
*Assistant Examiner* — Ingrid Wright
(74) *Attorney, Agent, or Firm* — Ray Quinney & Nebeker; Paul N. Taylor; Qudus Olaniran

(57) ABSTRACT

Structures include a substrate having a base surface. The base surface includes a plurality of protrusions extending from the base surface and/or a plurality of depressions extending into the base surface. The structures include a molded liner. The molded liner encapsulates the plurality of protrusions and/or the molded liner extends into at least a portion of the plurality of depressions.

20 Claims, 8 Drawing Sheets

(56) References Cited

U.S. PATENT DOCUMENTS

| | | |
|---|---|---|
| 5,204,055 A | 4/1993 | Sachs et al. |
| 5,678,162 A | 10/1997 | Barlow et al. |
| 7,087,200 B2 | 8/2006 | Taboas et al. |
| 8,016,586 B2 | 9/2011 | Entezarian et al. |
| 2005/0276945 A1 | 12/2005 | Muggli et al. |
| 2006/0055084 A1 | 3/2006 | Yamaguchi et al. |
| 2009/0017242 A1 | 1/2009 | Weber et al. |
| 2010/0316878 A1 | 12/2010 | Naritomi et al. |
| 2011/0129924 A1 | 6/2011 | Ying et al. |
| 2013/0157038 A1 | 6/2013 | Chiang et al. |
| 2014/0180431 A1 | 6/2014 | Conway et al. |
| 2014/0202975 A1* | 7/2014 | Tom .................. B67D 7/025 215/12.1 |
| 2014/0224277 A1* | 8/2014 | Vasquez .............. A47J 43/24 134/6 |
| 2015/0134095 A1 | 5/2015 | Hemani et al. |
| 2015/0210894 A1 | 7/2015 | Malofsky et al. |
| 2016/0151993 A1 | 6/2016 | Ikeda et al. |

FOREIGN PATENT DOCUMENTS

| | | |
|---|---|---|
| JP | 1146725 A | 6/1989 |
| JP | 2002302795 A | 10/2002 |
| WO | 2015008771 A1 | 1/2015 |
| WO | 2015101319 A1 | 7/2015 |

OTHER PUBLICATIONS

Nouri, et al., "Biomimetic Porous Titanium Scaffolds for Orthopedic and Dental Applications", In Publication of InTech, Mar. 1, 2010, pp. 415-450.

Grujicic, et al, "An Overview of the Polymer-to-Metal Direct-Adhesion Hybrid Technologies for Load-Bearing Automotive Components", In Journal of Materials Processing Technology, vol. 197, Issues 1-3, Feb. 2008, 12 pages.

"International Search Report and Written Opinion Issued in PCT Application No. PCT/US2017/018018", dated May 2, 2017, 13 Pages.

* cited by examiner

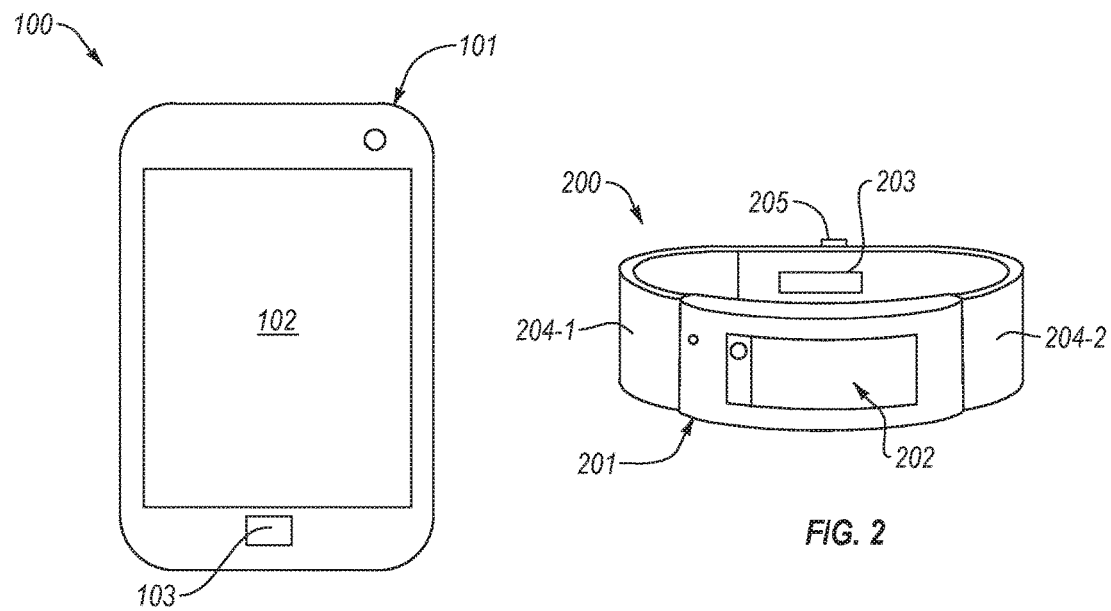
FIG. 1
FIG. 2
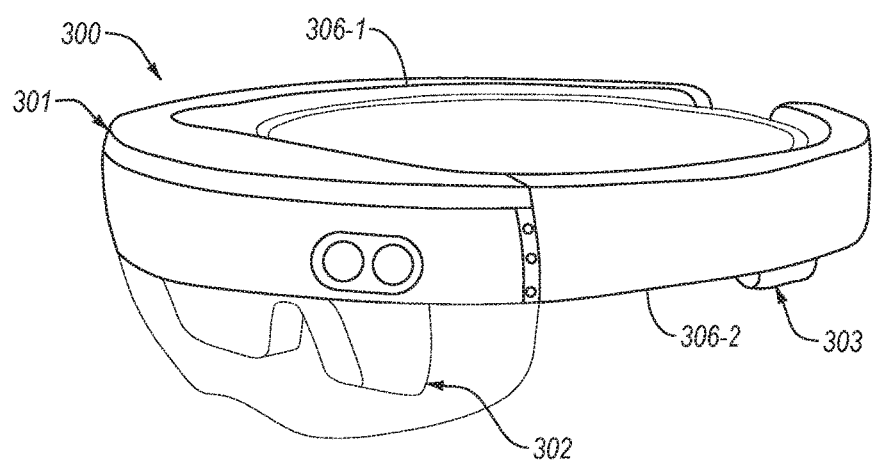
FIG. 3

STRUCTURES HAVING A MOLDED LINER ATTACHED TO A SUBSTRATE

BACKGROUND

Background and Relevant Art

Electronic components are typically sensitive to sources of damage such as direct impacts and fluids. Housings may be used to protect electronic components from damage. Many housings are injection molded or machined from a stock material. Injection molded housings may have insufficient strength. Machined housings may be heavy.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment includes a structure. The structure may house electronic components. The structure includes a substrate with a base surface. In some embodiments, the base surface has a plurality of protrusions extending from the base surface. In further embodiments, a plurality of depressions extend into the base surface. The structure includes a molded liner. The molded liner, in embodiments with a plurality of protrusions, encapsulates at least a portion of the plurality of protrusions. In embodiments with a plurality of depressions, the molded liner extends into at least a portion of the plurality of depressions.

One embodiment includes an electronic device. The electronic device includes a substrate with a base surface and a plurality of protrusions extending from the base surface. The electronic device includes a molded liner. The molded liner encapsulates the plurality of protrusions. The electronic device includes an electronic component abutting the molded liner.

One embodiment includes an electronic device. The electronic device includes a substrate having a base surface with a plurality of depressions extending into the base surface. The electronic device includes a molded liner. The molded liner extends into at least a portion of the plurality of depressions. The electronic device includes an electronic component abutting the molded liner.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that these drawings depict only typical embodiments and are not therefore to be considered to be limiting in scope, embodiments will be described and explained with additional specificity and detail through the use of the accompanying drawings in which:

FIG. 1 is a conceptual drawing of an embodiment of a mobile device;

FIG. 2 is a conceptual drawing of an embodiment of a watch-type wearable device;

FIG. 3 is a conceptual drawing of an embodiment of a head-worn wearable device;

FIG. 13-1 is a perspective view of an assembled embodiment of a structure for housing electronic components; and FIG. 13-2 is an exploded perspective view of the embodiment of a structure for housing electronic components shown in FIG. 13-1.

DETAILED DESCRIPTION

Figure 4:
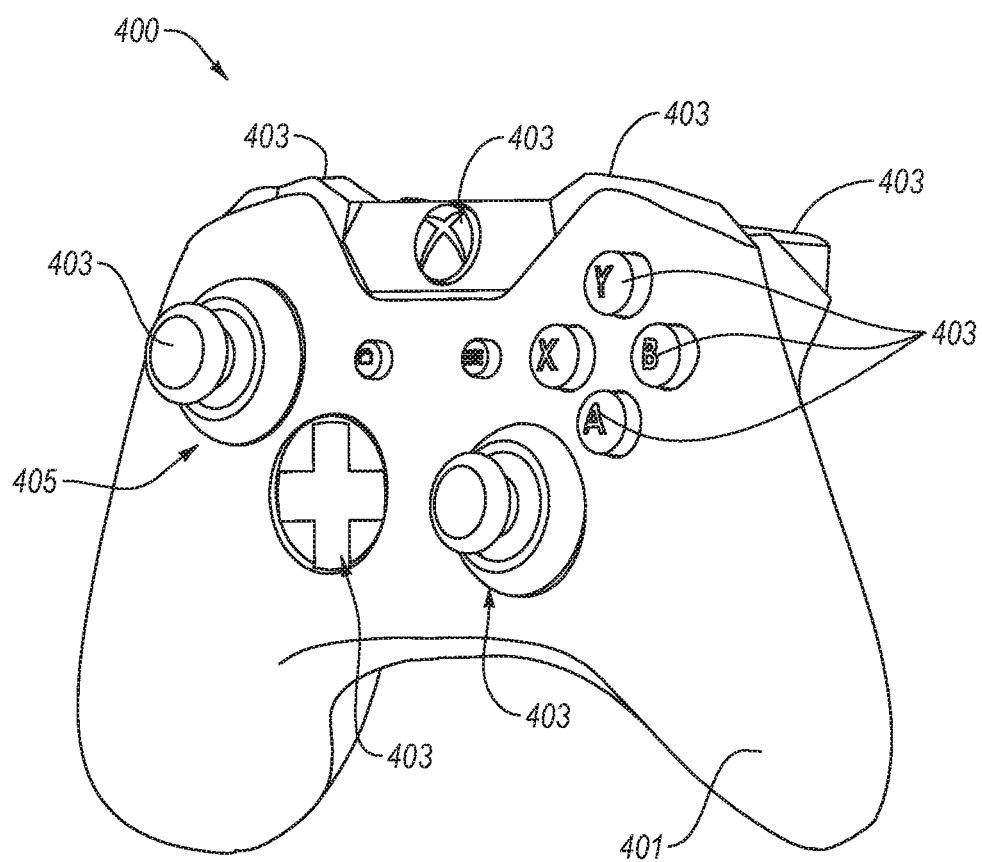
FIG. 4 is a perspective view of an embodiment of a video game controller.

One or more specific embodiments of the present disclosure will be described below. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

At least one embodiment disclosed herein may facilitate attachment of a molded liner to a substrate. For example, protrusions and/or depressions (e.g., undercuts) may extend from and/or into a base surface of the substrate such that the molded liner attaches to the protrusions and/or depressions. In at least one embodiment, the protrusions and/or depressions may be formed by additive printing (e.g., three-dimensional printing). For example, material may be added to a substrate. In other embodiments, the protrusions and/or depressions may be otherwise formed. In at least one embodiment disclosed herein, the protrusions may have a cross-sectional dimension (e.g., thickness) of less than forty micrometers.

At least one embodiment disclosed herein includes a molded liner that is not made of Polyphenylene Sulfide (PPS) or Polybutylene Terephthalate (PBT). In at least one embodiment disclosed herein, the protrusions and/or depressions extend onto a side wall of the substrate. In at least one embodiment disclosed herein, the substrate may be an alloy of steel. In at least one embodiment described herein, the structure may form a watertight seal. In at least one embodiment described herein, the molded liner may electrically isolate electronic components from a metal substrate.

In at least one embodiment described herein, a density of the structure including the substrate and molded liner may be less than a structure having the same shape and size formed of a single material.

In at least one embodiment described herein, the structure may be incorporated into an electronic device. For example, referring now to FIG. 1, a conceptual drawing of an embodiment of a mobile device 100 is shown. The mobile device 100 (e.g., a smart phone and/or tablet) includes a structure 101 for housing various electronic components. For example, the structure 101 may house a processor, memory, a battery, one or more sensors, a transceiver, other internal components, or combinations thereof may be associated with the mobile device 100. The structure 101 may be similar to other structures described herein. Like numbers indicate like elements.

The mobile device 100 may include a display 102. The display 102 may display various pieces of information to a user via, for example, a graphical user interface.

The mobile device 100 may include an input 103. The input 103 may communicate with the mobile device 100 to control what is displayed on the display 102. For example, the input 103 may be a start button (e.g., a start button on a smart phone and/or tablet). In some embodiments, the display 102 may act as an input. For example, the display 102 may include touch sensors that facilitate user input with the mobile device 100.

Figures 1, 13:
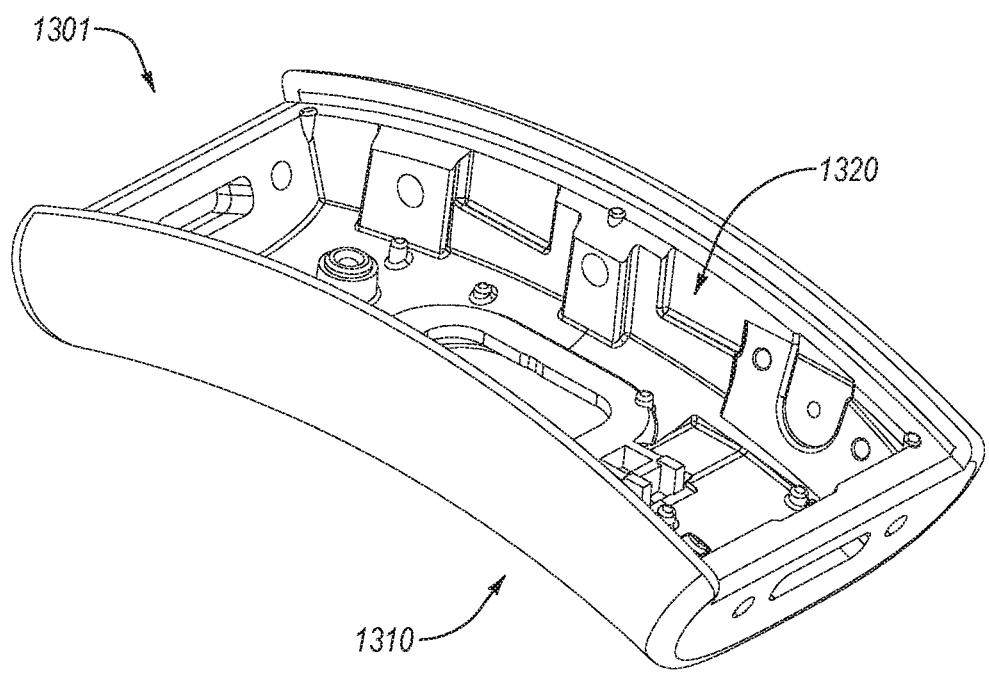

One or more elements of one or more of the structures described herein may be incorporated into the structure 101 of FIG. 1 and vice versa. For example, the structure 101 may include a substrate that may include one or more protrusions and/or one or more depressions as will be described herein.

Figures 2, 13:
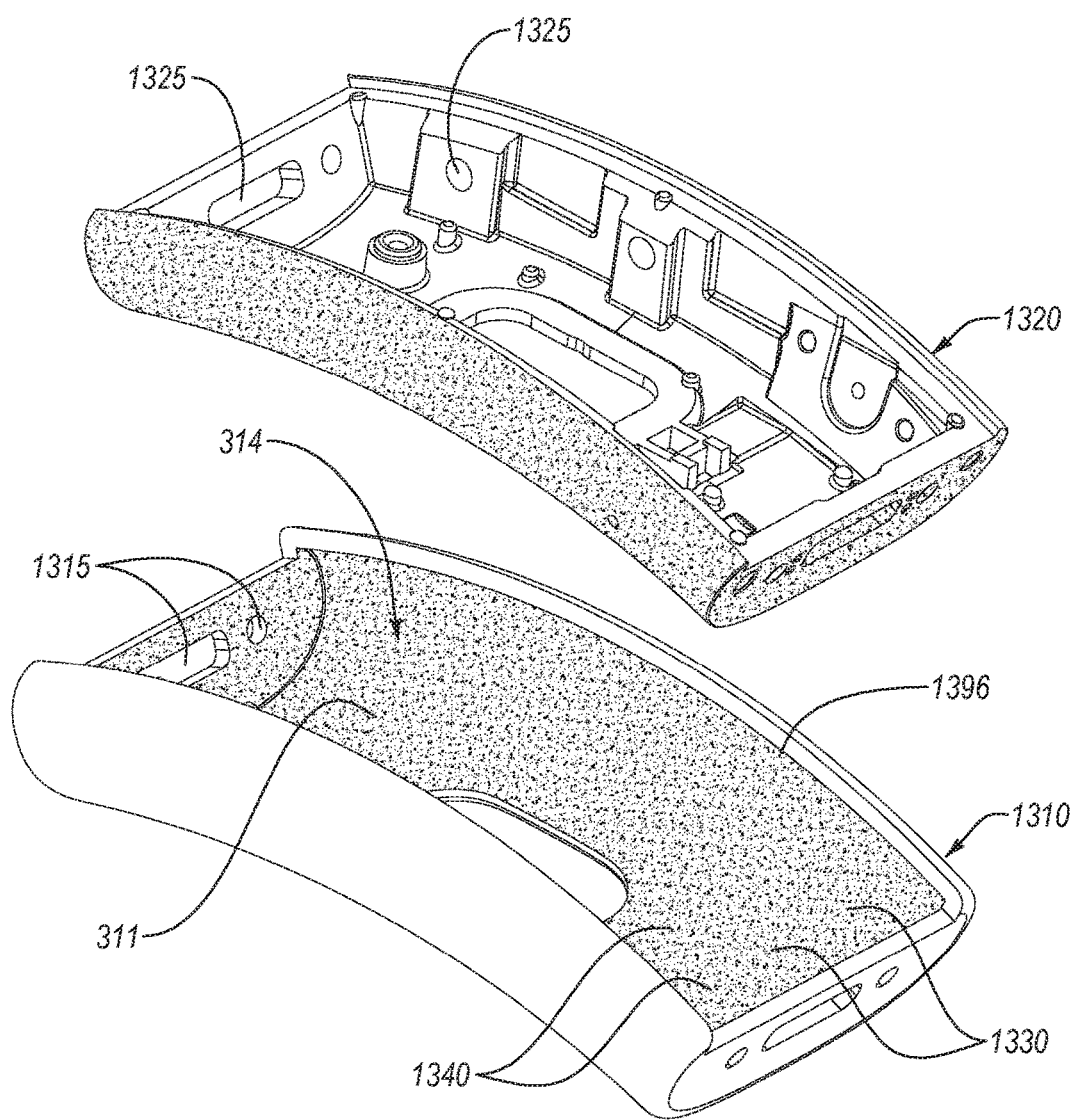

FIG. 2 is a conceptual drawing of an embodiment of a watch-type wearable device 200. The wearable device 200 is illustrated as a watch-type wearable device. The wearable device 200 includes a structure 201 for housing various electronic components. The structure 301 may be similar to other structures described herein. Like numbers indicate like elements.

The wearable device 200 may include a display 202 that may display information and/or act as an input (similar to input 103 and/or display 102).

The wearable device 200 may include an input 203. The input 203 may be used to interact with a user. In the present embodiment, the input 203 may be used to measure a user's heart rate. In some embodiments, the input 203 may otherwise interact with a user.

The wearable device 200 may include a first strap 204-1 and a second strap 204-2. The first and second straps 204-1, 204-2 may connect to the structure 201 for housing electronic components. The first and second straps 204-1, 204-2 may connect together using a clasp 205.

One or more elements of one or more of the structures 201 may be incorporated into the structure 201 of FIG. 2 and vice versa. For example, the structure 201 may include a substrate that may include one or more protrusions and/or one or more depressions as will be described herein.

FIG. 3 is a conceptual drawing of an embodiment of a head-worn wearable device 300. The wearable device 300 may include one or more structures 301. Although the wearable devices 200, 300 described in FIGS. 2 and 3 include a watch-type (FIG. 2) and a head-worn (FIG. 3) wearable devices, other wearable devices and/or other devices (e.g., optical accessories, security cameras, and automobile rear view cameras) with a structure (e.g., structures 101, 201, 301) may also be used. The one or more structures 301 may be similar to other structures described herein. Like numbers indicate like elements.

The wearable device 300 may include a display 302 that may display information (similar to displays 102, 202). The display 302 may act as an input (similar to inputs 103, 203).

The wearable device 300 may include an input 303 that may be used to interact with a user. In the present embodiment, the input 303 may be a microphone that may be used to execute voice-based and/or other commands In some embodiments, the input 303 may otherwise interact with a user.

The wearable device 300 may include a first earpiece 306-1 and a second earpiece 306-2. The first and second earpieces 306-1, 306-2 may be connected to the structure 301. In some embodiments, the first and/or second earpieces 306-1, 306-2 may include one or more structures for housing electronic components. The first and second earpieces 306-1, 306-2 may support the wearable device 300.

One or more elements of one or more of the structures 101, 201 may be incorporated into the structure 301 of FIG. 3 and vice versa. For example, the structure 301 may include a substrate that may include one or more protrusions and/or one or more depressions as will be described herein.

Referring now to FIG. 4, a perspective view of an embodiment of a video game controller 400 is shown. The video game controller 400 includes a structure 401 for housing various electronic components. The structure 401 may be similar to other structures described herein. Like numbers indicate like elements.

The video game controller 400 may include one or more inputs 403. The inputs 403 may be used to interact with a user. In the present embodiment, the input 403 may be used to interact with a video game console or computing device. One or more of the inputs 403 may extend through one or more apertures 405 in the structure 401.

One or more elements of one or more of the structures 101, 201, 301 may be incorporated into the structure 401 of FIG. 4 and vice versa. For example, the structure 401 may include a substrate that may include one or more protrusions and/or one or more depressions as will be described herein.

Figure 5:
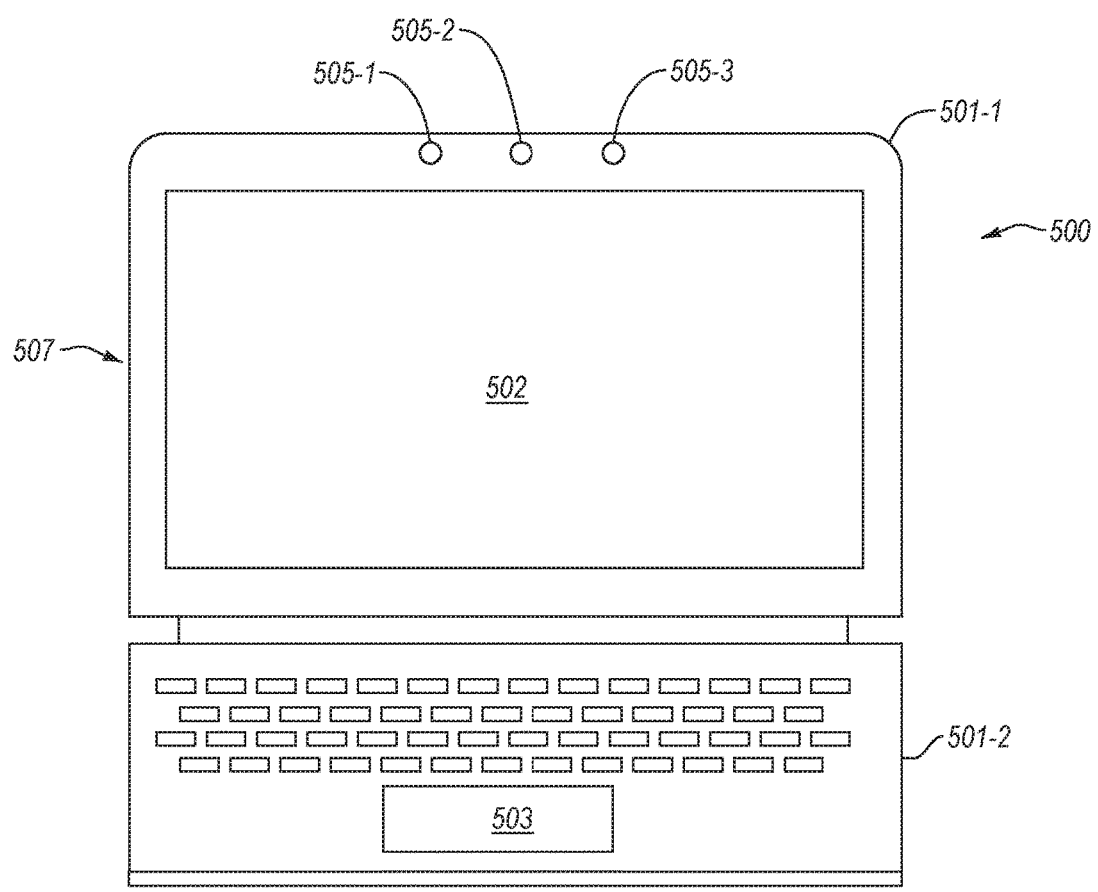
FIG. 5 is a conceptual drawing of an embodiment of a computing device.

FIG. 5 is a conceptual drawing of an embodiment of a computing device 500. The computing device 500 may include a structure 501 for housing various electronic components. The structure 501 may be similar to other structures described herein. Like numbers indicate like elements.

The computing device 500 is illustrated as a laptop-type computing device. In other embodiments, the computing device 500 may be a desktop computing device with an attached monitor, may be a gaming system with an attached monitor and/or attached peripherals, or may be another computing device. One or more elements of one or more of the structures 101, 201, 301, 401 may be incorporated into the structure 501 of FIG. 5 and vice versa.

The computing device 500 may include an input device 503 that may be used to interact with a user. The input device 503 may include a keyboard, mouse, trackpad, other input, or combinations thereof.

The computing device 500 may include a monitor 507. The monitor 507 may be attached to an input device 503. In other embodiments, the monitor 507 may be physically detached, but in electronic communication with the input device 503. In further embodiments, the monitor 507 may be detachable from the input device 503. The monitor 507 may include a display 502. The display 502 may display information (e.g., in a standard monitor) and/or act as an input (e.g., a touch screen monitor). The monitor 507 may include one or more apertures 505-1, 505-2, 505-3 for image or other sensors (not shown).

The monitor 507 may have a gap 506 between the display 502 and the structure 501. At least one embodiment of a structure for housing electronic components described herein may remove the gap (e.g., display gap 506 shown in FIG. 5) between an edge of the display (e.g., display 502) and the structure 501. For example, the structure 501 may include a molded liner (e.g., molded liners 620, 720, 820 920, 1320) described below) that abuts the monitor 507. In another example, the structure 701 may include a gasket material (e.g., rubber, Teflon, other gasket materials) that abuts the molded liner and the monitor 507.

One or more elements of one or more of the structures 101, 201, 301, 401 may be incorporated into the structure 501 of FIG. 5 and vice versa. For example, the structure 501 may include a substrate that may include one or more protrusions and/or one or more depressions as will be described herein.

Figure 6:
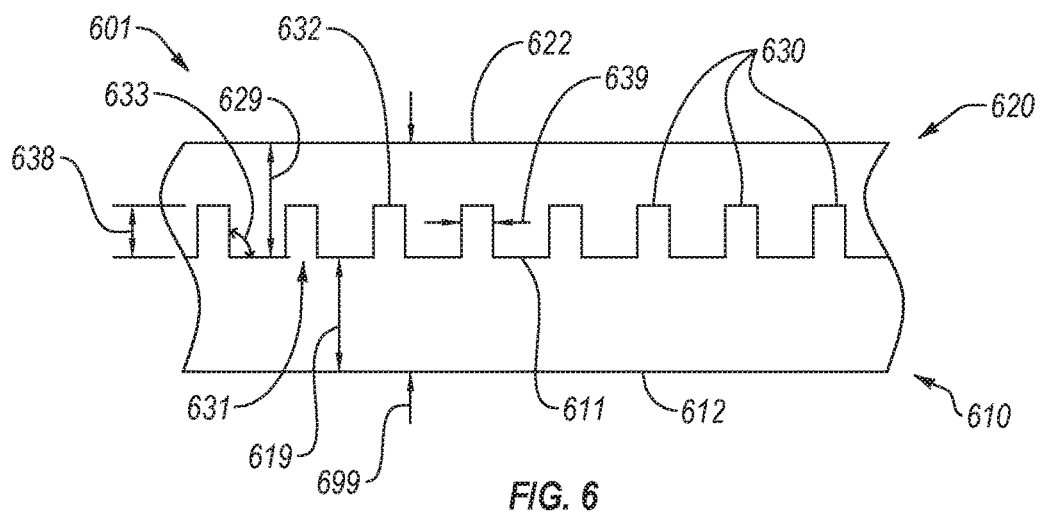
FIG. 6 is a partial cross-sectional side view of an embodiment of a structure for housing electronic components.

Referring to FIG. 6, a partial cross-sectional side view of an embodiment of a structure 601 for housing electronic components. The structure 601 may be similar to other structures described herein. Like numbers indicate like elements.

The structure 601 includes a substrate 610 and a molded liner 620. The substrate 610 includes a base surface 611 and an outer surface 612. The molded liner 620 may include an outer surface 622. One or more protrusions 630 may extend from the base surface 611 of the substrate 610. The protrusions 630 may be formed by adding material to the substrate 610. For example, the protrusions 630 may be three-dimensionally printed onto the substrate 610. The protrusions 630 may be formed by removing material from the substrate 610. For example, the protrusions 630 may be laser cut, etched, machining, or otherwise formed into the substrate 610.

The molded liner 620 may encapsulate at least one of the one or more protrusions 630. For example, the molded liner 620 may abut both the base surface 611 of the substrate 610 and at least one of the one or more protrusions 630.

The molded liner 620 may be molded onto the substrate 610. For example, the molded liner 620 may be injection molded into a mold that includes the substrate 610.

The one or more protrusions 630 may be similarly shaped, as shown. In other embodiments, the one or more protrusions 630 may vary in shape from protrusion to protrusion. The one or more protrusions 630 may be columnar, as shown. For example, the one or more protrusions 630 may extend perpendicularly from the base surface 611 of the substrate 610. In other embodiments, the one or more protrusions 630 may be otherwise shaped.

The substrate 610 may be formed of stainless steel, other carbon steels, titanium, aluminum, other metals, or alloys thereof. The substrate 610 may be formed of plastics. The molded liner 620 may be formed of thermoplastics, cast epoxies, urethanes, other materials, or combinations thereof.

The one or more protrusions 630 may have a height 638 that may extend from the base 631 (e.g., from base surface 611 of the substrate 610) of the one or more protrusions 630 to a distal end 632 of the one or more protrusions 630. The height 638 of the one or more protrusions 630 may be between about forty micrometers and three-hundred micrometers. In some embodiments, the height 638 may be a minimum of forty micrometers. In another example, the height 638 may be a maximum of three-hundred micrometers.

The one or more protrusions 630 may have a thickness 639. The thickness 639 may be between about twenty five micrometers and one hundred and fifty micrometers. For example, the thickness 639 may be a minimum of twenty five micrometers. In another example, the thickness 639 may be a maximum of one hundred and fifty micrometers.

The substrate 610 may have a thickness 619 that may extend from the base surface 611 to the outer surface 612. The thickness 619 may be more than 70 micrometers. For example, the thickness 619 of the substrate 610 may be 1,000 micrometers. In another example, the thickness 619 may be 150 micrometers.

The molded liner 620 may have a thickness 629 that may extend from the base surface 611 of the substrate 610 to the outer surface 622 of the molded liner 620. The thickness 629 may range from three hundred micrometers to 2,000 micrometers. For example, the thickness 629 of the molded liner 620 may be a maximum of 2,000 micrometers. In another example, the thickness 629 may be a minimum of three hundred micrometers.

The structure 601 may have a thickness 699. The thickness 699 may extend from the outer surface 612 of the substrate 610 to the outer surface 622 of the molded liner 620. The thickness 699 may be at least 370 micrometers. For example, the thickness 699 of the structure 601 may be a 3,000 micrometers. In another example, the thickness 699 may be 2,000 micrometers.

One or more elements of one or more of the structures 101, 201, 301, 401, 501 may be incorporated into the structure 601 of FIG. 6 and vice versa. For example, the structures 101, 201, 301, 401, 501 may include a substrate 610 that may include one or more protrusions 630.

Figure 7:
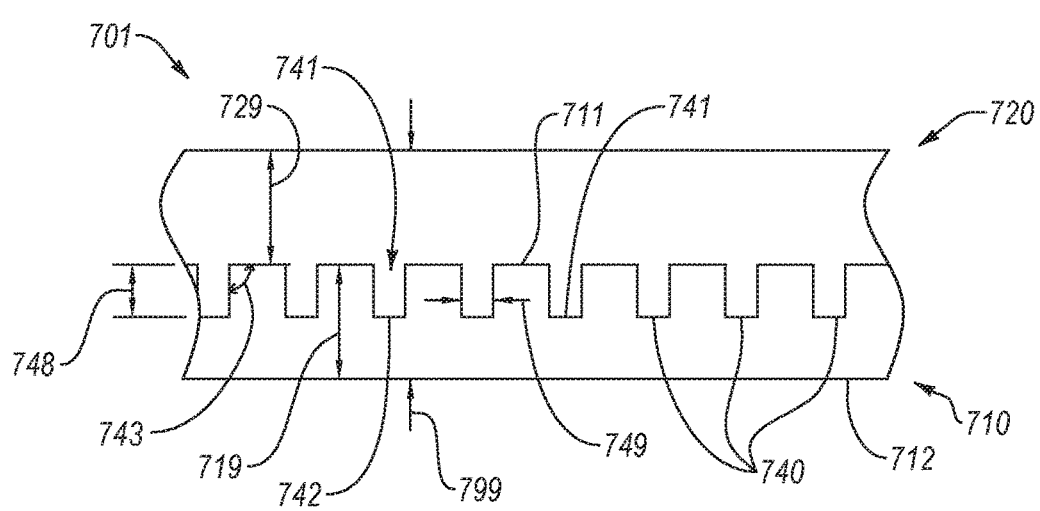
FIG. 7 is a partial cross-sectional side view of another embodiment of a structure for housing electronic components.

FIG. 7 is a partial cross-sectional side view of an embodiment of a structure 701 for housing electronic components. The structure 701 may be similar to other structures described herein. Like numbers indicate like elements.

The structure 701 includes a substrate 710 and a molded liner 720. The substrate 710 includes a base surface 711 and an outer surface 712. One or more depressions 740 may extend into the base surface 711 of the substrate 710. The one or more depressions 740 may include an innermost surface 742. The depressions 740 may be formed by removing material from the substrate 710. For example, the depressions 740 may be laser cut, etched, or otherwise formed into the substrate 710. The depressions 740 may be formed by adding material to the substrate 710. For example, the depressions 740 may be three-dimensionally printed onto the substrate 710.

The molded liner 720 may extend into at least one of the one or more depressions 740. For example, the molded liner 720 may abut both the base surface 711 of the substrate 710 and at least one of the one or more depressions 740. In another example, the molded liner 720 may abut both the base surface 711 of the substrate 710 and the innermost surface 742 of the one or more depressions 740.

The molded liner 720 may be molded onto the substrate 710. For example, the molded liner 720 may be injection molded into a mold that includes the substrate 710.

The one or more depressions 740 may be similarly shaped, as shown. In other embodiments, the one or more depressions 740 may vary in shape from depression to depression. The one or more depressions 740 may be columnar, as shown. For example, the one or more depressions 740 may extend perpendicularly into the base surface 711 of the substrate 710. In other embodiments, the one or more depressions 740 may be otherwise shaped. Although the one or more depressions 740 are shown as only partially extending into the substrate 710, in other embodiments, one or more of the depressions 740 may extend through the substrate 710.

The one or more depressions 740 may have a depth 748 that may extend from the base 741 (e.g., from base surface 711 of the substrate 710) of the one or more depressions 740 to the innermost surface 742 of the one or more depressions 740. The depth 748 of the one or more depressions 740 may be between about thirty micrometers and one hundred and twenty five micrometers. In some embodiments, the depth 748 may be a minimum of thirty micrometers. In another example, the depth 748 may be a maximum of one hundred and twenty five micrometers.

The one or more depressions 740 may have a thickness 749. The thickness 749 may be between about twenty five micrometers and three hundred micrometers. For example, the thickness 749 may be a minimum of twenty five micrometers. In another example, the thickness 749 may be a maximum of three hundred micrometers.

The substrate 710 may have a thickness 719 that may extend from the base surface 711 to the outer surface 712. The molded liner 720 may have a thickness 729 that may extend from the base surface 711 of the substrate 710 to the outer surface 722 of the molded liner 720. The structure 701 may have a thickness 799. The thickness 799 may extend from the outer surface 712 of the substrate 710 to the outer surface 722 of the molded liner 720.

One or more elements of one or more of the structures 101, 201, 301, 401, 501, 601 may be incorporated into the structure 701 of FIG. 7 and vice versa. For example, the structures 101, 201, 301, 401, 501, 601 may include one or more depressions 740.

Figure 8:
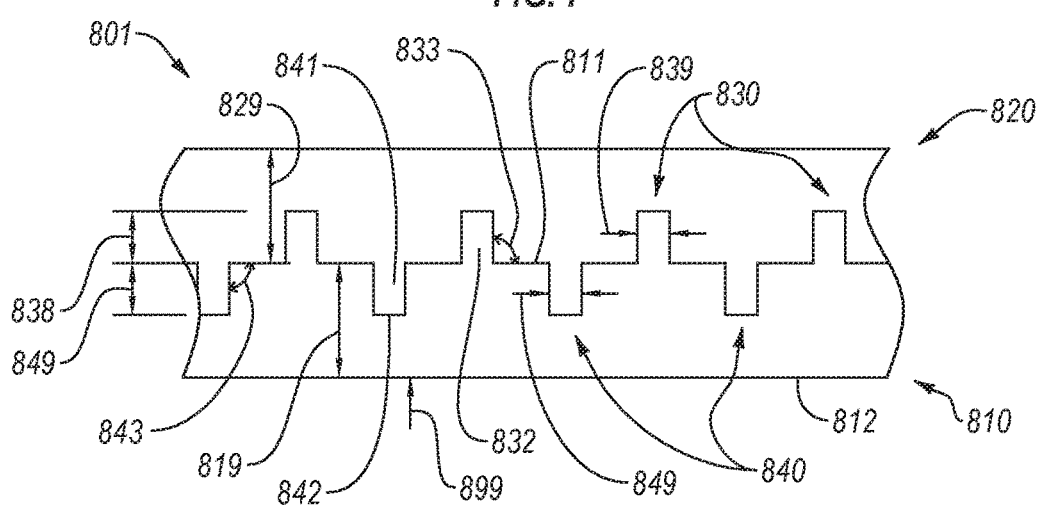
FIG. 8 is a partial cross-sectional side view of a further embodiment of a structure for housing electronic components.

FIG. 8 is a partial cross-sectional side view of an embodiment of a structure 801 for housing electronic components. The structure 801 may be similar to other structures described herein. Like numbers indicate like elements.

The structure 801 includes a substrate 810 and a molded liner 820. The substrate 810 includes a base surface 811 and an outer surface 812. One or more protrusions 830 may extend from and/or one or more depressions 840 may extend into the base surface 811 of the substrate 810. The one or more protrusions 830 may include a base 831 and a distal end 832. The one or more depressions 840 may include an innermost surface 842. The molded liner 820 may encapsulate and/or extend into at least one of the one or more protrusions 830 and/or at least one of the one or more depressions 840, respectively. For example, the molded liner 820 may abut both the base surface 811 of the substrate 810 and at least one of the one or more protrusions 830 and/or at least one of the one or more depressions 840. In another example, the molded liner 820 may abut both the base surface 811 of the substrate 810 and the distal end 832 of the one or more protrusions 830 and/or the innermost surface 842 of the one or more depressions 840.

In at least one embodiment having both protrusions 830 and depressions 840, the molded liner 820 may have increased adherence to the substrate 810. An unequal number of protrusions 830 and depressions 840 (e.g., more protrusions 830 than depressions 840) are shown. In other embodiments an equal number of protrusions 830 and depressions 840 may be used. In further embodiments, the substrate 810 may include more depressions 840 than protrusions 830.

The molded liner 820 may be molded onto the substrate 810. For example, the molded liner 820 may be injection molded into a mold that includes the substrate 810. The one or more protrusions 830 and/or the one or more depressions 840 may be similarly shaped, may vary in shape, etc.

The one or more protrusions 830 may have a height 838 that may extend from the base 831 (e.g., from base surface 811 of the substrate 810) of the one or more protrusions 830 to a distal end 832 of the one or more protrusions 830. The one or more protrusions 830 may have a thickness 839.

The one or more depressions 840 may have a depth 848 that may extend from the base 841 (e.g., from base surface 811 of the substrate 810) of the one or more depressions 840 to the innermost surface 842 of the one or more depressions 840. The one or more depressions 840 may have a thickness 849.

The substrate 810 may have a thickness 819 that may extend from the base surface 811 to the outer surface 812. The molded liner 820 may have a thickness 829 that may extend from the base surface 811 of the substrate 810 to the outer surface 822 of the molded liner 820. The structure 801 may have a thickness 899. The thickness 899 may extend from the outer surface 812 of the substrate 810 to the outer surface 822 of the molded liner 820.

One or more elements of one or more of the structures 101, 201, 301, 401, 501, 601, 701 may be incorporated into the structure 801 of FIG. 8 and vice versa. For example, the structures 101, 201, 301, 401, 501, 601, 701 may include one or more protrusions 830 and one or more depressions 840.

Figure 9:
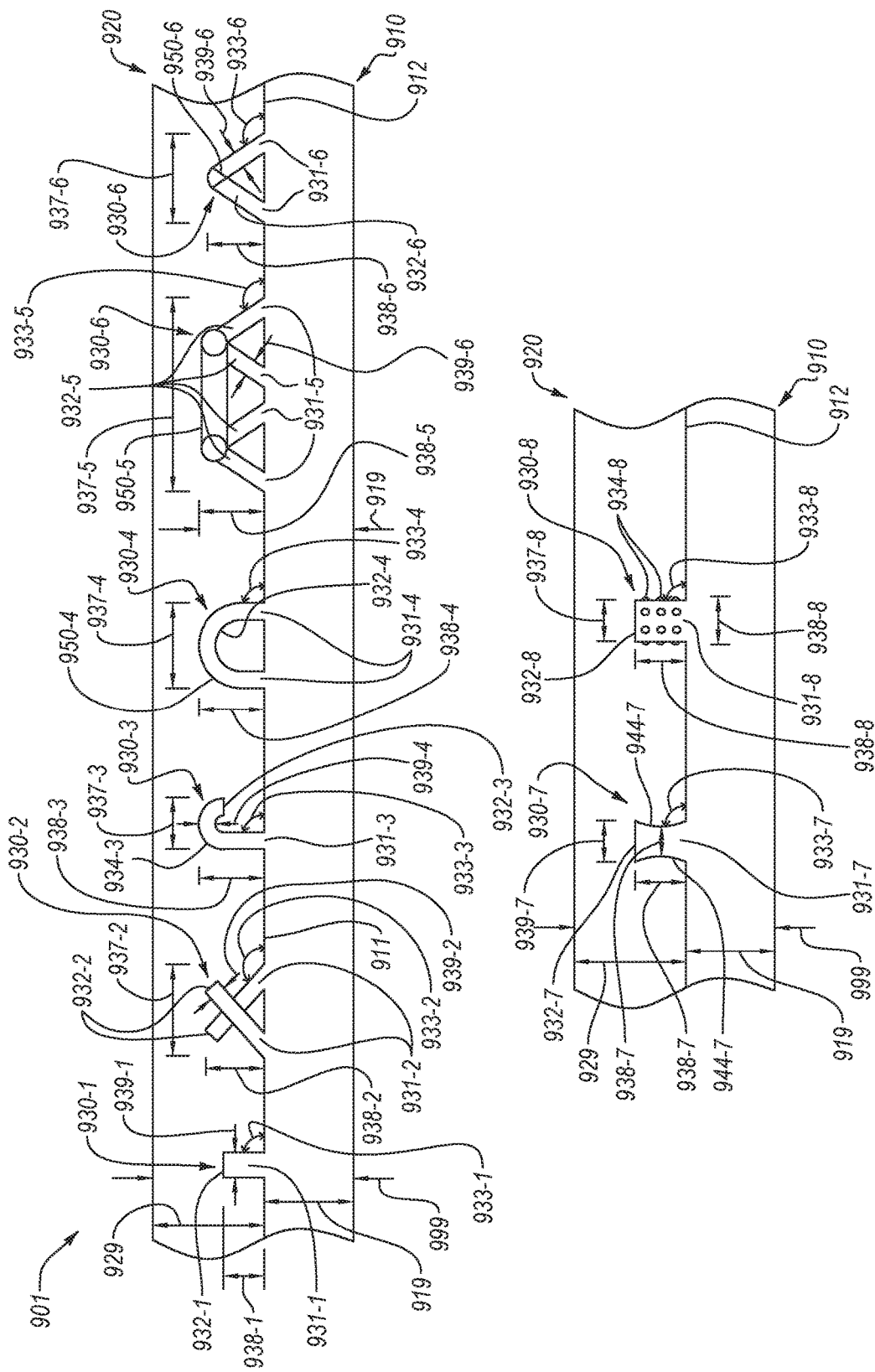
FIG. 9 is a partial cross-sectional side view of a yet further embodiment of a structure for housing electronic components.

FIG. 9 is a partial cross-sectional side view of an embodiment of a structure 901 for housing electronic components. The structure 901 may be similar to other structures described herein. Like numbers indicate like elements.

The structure 901 includes a substrate 910 and a molded liner 920. The molded liner 920 may be molded onto the substrate 910. The substrate 910 includes a base surface 911 and an outer surface 912. The substrate 910 is illustrated with various shaped protrusions 930 (e.g., protrusions 930-1, 930-2, 930-3, 930-4, 930-5). It will be understood that the layer marked as the molded liner 920 may, in other embodiments, be considered the substrate such that the illustrated protrusions 930 may be considered depressions. In further embodiments, one or more protrusions 930 may extend from and/or one or more depressions (not shown) may extend into the base surface 911 of the substrate 910 and the one or more protrusions 930 and/or depressions (not shown) may have various shapes.

The one or more protrusions 930 may include a base 931 and a distal end 932. The molded liner 920 may encapsulate at least one of the one or more protrusions 930.

The substrate 910 may have a thickness 919 that may extend from the base surface 911 to the outer surface 912.

The molded liner 920 may have a thickness 929 that may extend from the base surface 911 of the substrate 910 to the outer surface 922 of the molded liner 920. The structure 901 may have a thickness 999. The thickness 999 may extend from the outer surface 912 of the substrate 910 to the outer surface 922 of the molded liner 920.

A first protrusion 930-1 may be columnar, as shown. For example, the first protrusion 930-1 may extend perpendicularly from the base surface 911 of the substrate 910. The first protrusion 930-1 may have a base 931-1 and a distal end 932-1. The first protrusion 930-1 may have a height 938-1 that may extend from the base 931-1 (e.g., from base surface 911 of the substrate 910) of the first protrusion 930-1 to the distal end 932-1 of the first protrusion 930-1. The first protrusion 930-1 may have a cross-sectional thickness 939-1.

Second protrusions 930-2 may cross each other (e.g., intersect but continue on or overlap without intersecting), as shown. For example, the second protrusions 930-2 may extend at an angle 933-2 from the base surface 911 of the substrate 910 toward each other until they cross each other, as shown. The second protrusions 930-2 are shown overlapping. In other embodiments, the second protrusions 930-2 may intersect at a junction (not shown). The second protrusions 930-2 may each have a base 931-2 and a distal end 932-2. The second protrusions 930-2 may have a height 938-2 that may extend from the bases 931-2 (e.g., from base surface 911 of the substrate 910) of the second protrusions 930-2 to the distal ends 932-2 of the second protrusions 930-2. The second protrusions 930-2 may have a combined width 937-2. The second protrusions 930-2 may include an individual length (e.g., from the base 931-2 to the distal end 932-2 along the second protrusion 930-2) and/or an individual cross-sectional thickness 939-2.

A third protrusion 930-3 may be hooked, as shown. For example, the third protrusion 930-3 may extend perpendicularly from the base surface 911 of the substrate 910 and a secondary protrusion 934-3 may extend back toward the base surface 911 of the substrate 910. The third protrusion 930-3 may have a base 931-3 and a distal end 932-3 at the end of the secondary protrusion 934-3. The third protrusion 930-3 may have a height 938-3 that may extend from the base 931-3 (e.g., from base surface 911 of the substrate 910) of the third protrusion 930-3 to the distal end 932-3 of the third protrusion 930-3. The third protrusion 930-3 may have a width 937-3. The third protrusion 930-3 may include a length (e.g., from the base 931-3 through the secondary protrusion 934-3 to the distal end 932-3 along the third protrusion 930-3) and/or a thickness 939-3.

Fourth protrusions 930-4 may be curved, as shown. For example, fourth protrusions 930-4 may extend from the base surface 911 of the substrate 910 in a curved path. The fourth protrusions 930-4 may each have a base 931-4 and a distal end 932-4. The fourth protrusions 930-4 may connect to each other at their distal ends 932-4. For example, the fourth protrusions 930-4 may include a junction 950-4 that joins the distal ends 932-4 of the fourth protrusions 930-4. The fourth protrusions 930-4 may have a height 938-4 that may extend from the base 931-4 (e.g., from base surface 911 of the substrate 910) of the fourth protrusions 930-4 to the distal ends 932-4 of the fourth protrusions 930-4. The fourth protrusions 930-4 may have a combined width 937-4. The fourth protrusions 930-4 may each include an individual length (e.g., from the base 931-4 to the distal end 932-4 along the fourth protrusion 930-4) and/or an individual cross-sectional thickness 939-4.

Fifth protrusions 930-5 may be interconnected, as shown. For example, fifth protrusions 930-5 may extend from the base surface 911 of the substrate 910 and intersect at one or more junctions 950-5. The fifth protrusions 930-5 may each have a base 931-5 and a distal end 932-5. One or more of the fifth protrusions 930-5 may connect to each other at their distal ends 932-5. For example, two pairs of the fifth protrusions 930-5 are shown with a junction 950-5 that joins the distal ends 932-5 of the fifth protrusions 930-5. A secondary protrusion 934-5 may be connected at both ends at the two junctions 950-5. The fifth protrusions 930-5 may have a combined height 938-5 that may extend from the base 931-5 (e.g., from base surface 911 of the substrate 910) of the fifth protrusions 930-5 to the junctions 950-5 between the secondary protrusion 934-5. The fifth protrusions 930-5 may have a combined width 937-5. The fifth protrusions 930-5 and/or the secondary protrusion(s) 934-5 may each include an individual length (e.g., from the base 931-5 to the distal end 932-5 along the fifth protrusion 930-5 or along the secondary protrusion 934-5) and/or an individual cross-sectional thickness 939-5.

Sixth protrusions 930-6 may be interconnected, as shown. For example, sixth protrusions 930-6 may extend from the base surface 911 of the substrate 910 and intersect at a junction 950-6. The sixth protrusions 930-6 may each have a base 931-6 and a distal end 932-6. The sixth protrusions 930-6 may connect to each other at their distal ends 932-6 at a junction 950-6. The sixth protrusions 930-6 may have a combined height 938-6 that may extend from the bases 931-6 (e.g., from base surface 911 of the substrate 910) of the sixth protrusions 930-6 to the junction 950-6. The sixth protrusions 930-6 may have a combined width 937-6. The sixth protrusions 930-6 may each include an individual length (e.g., from the base 931-6 to the distal end 932-6 along the sixth protrusion 930-6) and/or an individual cross-sectional thickness 939-6.

A seventh protrusion 930-7 may be generally columnar like the first protrusion 930-1. For example, the seventh protrusion 930-7 may extend from the base surface 911 of the substrate 910. However, the seventh protrusion 930-7 may include an undercut 944-7. The seventh protrusion 930-7 may have a base 931-7 and a distal end 932-7. The undercut 944-7 may be curved from the base 931-7 to the distal end 932-7. In other embodiments, the undercut 944-7 may be otherwise shaped. For example, the distal end 932-7 may simply have a larger thickness than the base 931-7. The seventh protrusion 930-7 may have a height 938-7 that may extend from the base 931-7 (e.g., from base surface 911 of the substrate 910) of the seventh protrusion 930-7 to the distal end 932-7 of the seventh protrusion 930-7. The seventh protrusion 930-7 may have a cross-sectional thickness 939-7.

An eighth protrusion 930-8 may be generally columnar like the first protrusion 930-1. For example, the eighth protrusion 930-8 may extend from the base surface 911 of the substrate 910. However, the eighth protrusion 930-8 may include one or more secondary protrusions 934-8. The secondary protrusions 934-8 may extend from the outer surface of the eighth protrusions 930-8. The secondary protrusions 934-8 may be convex, as shown. In other embodiments, the secondary protrusions 934-8 may be otherwise shaped.

The eighth protrusion 930-8 may have a base 931-8 and a distal end 932-8. The eighth protrusion 930-8 may have a height 938-8 that may extend from the base 931-8 (e.g., from base surface 911 of the substrate 910) of the eighth protrusion 930-8 to the distal end 932-8 of the eighth protrusion 930-8. The eighth protrusion 930-8 may have a cross-sectional thickness 939-8.

One or more elements of one or more of the structures 101, 201, 301, 401, 501, 601, 701, 801 may be incorporated into the structure 901 of FIG. 9 and vice versa. For example, the structures 101, 201, 301, 401, 501, 601, 701, 801 may include one or more of the variously shaped protrusions (and/or depressions) such as the protrusions 930 (e.g., protrusions 930-1, 930-2, 930-3, 930-4, 930-5, 930-6).

Figure 10:
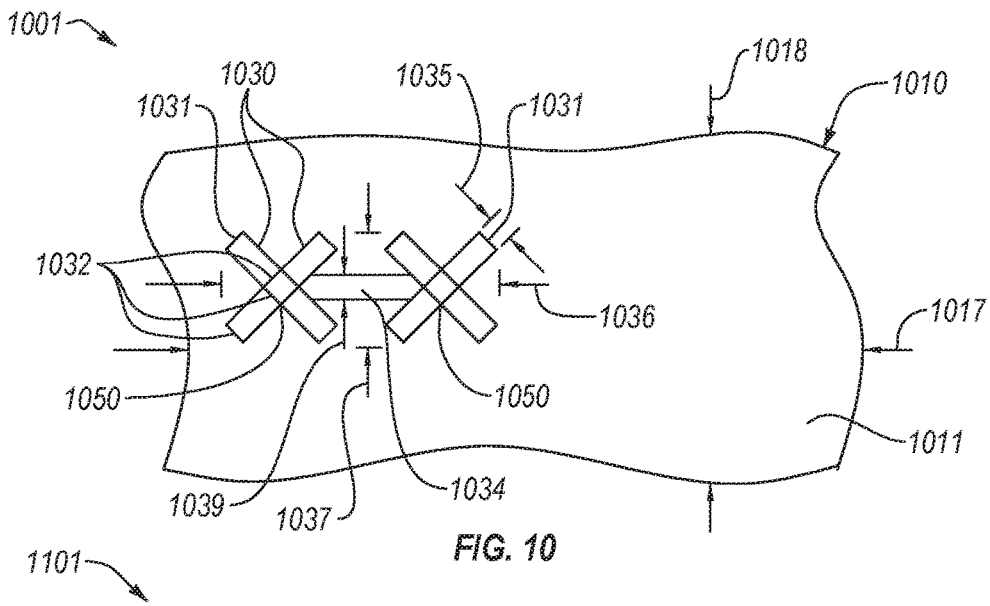
FIG. 10 is a partial top view of an embodiment of a structure for housing electronic components.

FIG. 10 is a partial top view of an embodiment of a structure 1001 for housing electronic components. The structure 1001 may be similar to other structures described herein. Like numbers indicate like elements.

The structure 1001 includes a substrate 1010 with a base surface 1011. A molded liner (not shown) may be molded onto the substrate 1010. The substrate 1010 is illustrated with multiple protrusions 1030 and a secondary protrusion 1034.

The one or more protrusions 1030 may include a base 1031 and a distal end 1032. A molded liner (not shown) may encapsulate at least one of the one or more protrusions 1030.

The substrate 1010 may have a width 1017 and a height 1018. The structure 1001 may have a width (same as width 1017) and a height (same as height 1018).

The protrusions 1030 may be columnar and/or may extend at an angle (e.g., similar to angle 933-5) from the base surface 1011 of the substrate 1010, as shown. The protrusions 1030 may have a base 1031 and a distal end 1032. As shown in FIG. 10, four of the protrusions 1030 intersect at their distal ends 1032 at a junction 1050. A secondary protrusion 1034 is shown extending between two junctions 1050.

The protrusions 1030 may have a height (in a direction into the page) that may extend from the base 1031 (e.g., from base surface 1011 of the substrate 1010) of the protrusions 1030-2 to the distal ends 1032 of the protrusions 1030. The protrusions may have a combined width 1037 and/or a combined length 1036. The protrusions 1030 may have a cross-sectional thickness 1039. As shown the protrusions 1030 may extend at an angle (not shown) from the base surface 1011 and at an angle relative to a longitudinal axis (e.g., along the secondary protrusion 1034). As shown, the angle from the base surface 1011 may a 45 degree angle and the angle from the longitudinal axis may be a 45 degree angle. In other embodiments, the angles may be larger or smaller. For example, the angle from the base surface 1011 and/or the angle from the longitudinal axis may be between 1 degree and 90 degrees.

The four protrusions 1030 on the left and the four protrusions 1030 on the right are shown as having the same angles relative to the base surface 1011 and the longitudinal axis and the same individual lengths, such that the secondary protrusion 1034 is parallel to the longitudinal axis and the base surface 1011. In other embodiments, one or more of the protrusions 1030 may differ from one or more of the protrusions 1030 such that the secondary protrusion 1034 is otherwise oriented.

One or more elements of one or more of the structures 101, 201, 301, 401, 501, 601, 701, 801, 901 may be incorporated into the structure 1001 of FIG. 10 and vice versa. For example, the structures 101, 201, 301, 401, 501, 601, 701, 801, 901 may include multiple interconnected protrusions (and/or depressions) that are connected by a secondary protrusion, such as the protrusions 1030 being connected by the secondary protrusion 103.

Figure 11:
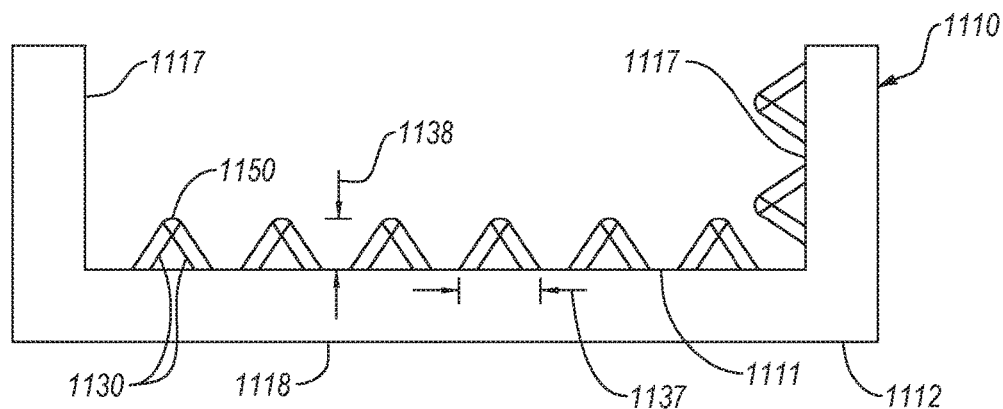
FIG. 11 is a partial top view of another embodiment of a structure for housing electronic components.

FIG. 11 is a partial top view of an embodiment of a structure 1101 for housing electronic components. The structure 1101 may be similar to other structures described herein. Like numbers indicate like elements.

The structure 1101 may include a substrate 1110 that may include a base portion 1118 and one or more side portions 1117. The one or more side portions 1117 and/or the base portion 1118 may be planar, as shown. In other embodiments, the one or more side portions 1117 and/or the base portion 1118 may be otherwise shaped (e.g., concave, convex, angled, stepped).

As shown in FIG. 11, a plurality of protrusions 1130 may extend along the base surface 1111 of the substrate 1110 including the entire the base portion 1118 and one of the side portions 1117. In other embodiments, the plurality of protrusions 1130 may extend along the base surface including at least a portion of one or more of the side portions 1117 and the base portion 1118.

The plurality of protrusions 1130 may extend along the entirety of the base surface 1111 or less than the entirety of the base surface 1111. For example, the plurality of protrusions 1130 may extend along the entire length (e.g., as shown) of the base surface 1111 and/or the entire width (not shown). In another example, the plurality of protrusions 1130 may extend along more than 25%, 30%, 35%, 40%, 45%, 50%, 55%, 60%, 65%, 70%, 75%, 80%, 85%, 90%, 95%, 100%, or any value therebetween of the base surface 1111 in an x-direction (e.g., along the length as shown), a y-direction (e.g., along the width), a z-direction (e.g., along the thickness), or combinations thereof.

The plurality of protrusions 1130 are shown as connected to the base surface 1111. In other embodiments, the plurality of protrusions 1130 (and/or a plurality of depressions) may extend along (and/or into) the outer surface 1112 of the substrate 1110.

One or more elements of one or more of the structures 101, 201, 301, 401, 501, 601, 701, 801, 901, 1001 may be incorporated into the structure 1101 of FIG. 11 and vice versa. For example, the plurality of protrusions 1130 are similar from the side view to protrusion 930-6 shown in FIG. 9. The plurality of protrusions 1130 may include a plurality of junctions 1150. The plurality of junctions 1150 may interconnect one or more protrusions 1130. The plurality of protrusions 1130 may be similar to the plurality of protrusions 1030 shown in FIG. 10. In other embodiments, other protrusion shapes or combinations thereof may be used.

Figure 12:
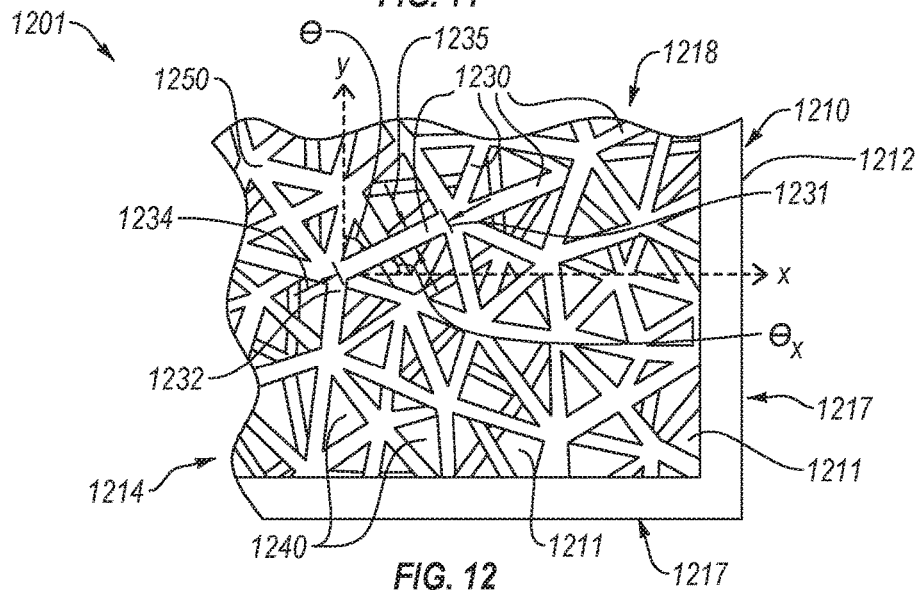
FIG. 12 is a partial cutaway top view of an embodiment of a structure for housing electronic components.

FIG. 12 is a partial cutaway top view of an embodiment of a structure 1201 for housing electronic components. The structure 1201 may be similar to other structures described herein. Like numbers indicate like elements.

The structure 1201 includes a substrate 1210. A pocket 1214 may be formed into the substrate 1210. The pocket 1214 may be bounded by a base surface 1211, one or more side portions 1217 (e.g., with two side portions 1217 shown), and a base portion 1218. A plurality of protrusions 1230 may extend from the base surface 1211 into the pocket 1214. Two or more of the plurality of protrusions 1230 may be connected at one or more junctions 1250. As described in previous embodiments, protrusions extend from the base surface and secondary protrusions extend between junctions. In the present embodiment, protrusions 1230 may extend from the base surface 1211, from junctions 1250, from an outer surface 1212, from other protrusions 1230, from other surfaces, or combinations thereof.

Each protrusions 1230 may include a first end 1231 (e.g., a base) and a second end 1232 (e.g., a distal end). A length 1234 may extend between the first and second ends 1231, 1232. Each protrusion may include a cross-sectional thickness 1235. The lengths and/or thicknesses of each protrusion 1230 may be the same or may vary. The protrusions 1230 are all shown as cylindrical (e.g., columnar) protrusions. In other embodiments, one or more of the protrusions 1230 may be the same shape and/or may vary in shape. Each protrusion 1230 may be oriented relative to the substrate 1210. For example, each protrusion 1230 may be oriented at an angle $\theta_x$ (e.g., relative to the x-axis), $\theta_y$ (e.g., relative to the y-axis), and $\theta_z$ (e.g., relative to the z-axis into the page). The plurality of protrusions 1230 may have a pattern. As shown, the pattern may be random. In other words, the orientation of each protrusion (e.g., about $\theta_x$, $\theta_y$, $\theta_z$ may vary relative to adjacent protrusions).

The plurality of protrusions 1230 may form a plurality of depressions 1240. A molded liner (e.g., molded liners 620, 720, 820 920, 1320) may encapsulate one or more of the protrusions 1230 and/or extend into one or more depressions 1240.

One or more elements of one or more of the structures 101, 201, 301, 401, 501, 601, 701, 801, 901, 1001, 1101 may be incorporated into the structure 1201 of FIG. 12 and vice versa. For example, the substrate 1210 is shown with a planar side portion 1217 similar from the side view to the side portion 1117 shown in FIG. 11. In other embodiments, other side portions may be used.

FIG. 13-1 is a perspective view of an assembled embodiment of a structure 1301 for housing electronic components. FIG. 13-2 is an exploded perspective view of the embodiment of a structure 1301 for housing electronic components shown in FIG. 13-1. Referring generally to FIGS. 13-1 and 13-2, the structure 1301 may be similar to other structures described herein. Like numbers indicate like elements.

The structure 1301 includes a substrate 1310 and a molded liner 1320. A pocket 1314 may be formed by a base surface 1311 of the substrate 1310. A plurality of protrusions 1330 may extend from the base surface 1311 and/or a plurality of depressions 1340 may extend into the base surface 1311.

The substrate 1310 may include a ledge 1396. The ledge 1396 may be a portion of the pocket 1314. For example, the ledge 1396 may be the uppermost (e.g., in the z-direction) edge of the pocket 1314. The ledge 1396 may extend transversely from the substrate 1310. For example, the ledge 1396 may extend at an angle between 0 degrees and 90 degrees from a base surface (not shown) of the substrate 1310. The ledge 1396 may abut a surface of the molded liner 1320. The ledge 1396 may facilitate retention of the molded liner 1320 within the substrate 1310. For example, in embodiments with a ledge 1396 the protrusions 1330 and/or depressions 1340 may extend over less than the entire base surface of the substrate 1310.

The molded liner 1320 is shown as a solid piece with depressions (e.g., corresponding to the protrusions 1330 extending from the substrate 1310) extending into the molded liner 1320. For example, the protrusions 1330 may be columnar such that when the molded liner 1320 is inserted the pocket 1314 of the substrate 1310, the protrusions 1330 extend into the depressions 1340. In embodiments where the molded liner 1320 is formed (e.g., injection molded, cast, otherwise formed) inside the pocket 1340, the molded liner 1340 would form around the protrusions 1330 and/or depressions 1340 in the substrate 1310.

The substrate 1310 may include one or more features 1315. The one or more features 1315 may include attachment features. The features 1315 may be used to affix the structure 1301 to other structures. For example, the structure 1301 may be used as the structure 201 shown in FIG. 2. The features 1315 may be used to affix the first and second straps 204-1, 204-2 to the structure 1301. The features 1315 may be apertures as shown. In other embodiments, the features may include pockets, slots, non-through holes, other features, or combinations thereof.

The molded liner 1320 may include features 1325. For example, where the molded liner 1320 is formed into the substrate, a mandrel or other forming device may be used to form features 1325 (e.g., apertures) in the molded liner 1320 that correspond with the features 1315 (e.g., apertures) in the substrate 1310. The molded liner 1320 may include features 1325 that may be used to attach various electronic or other components to the molded liner 1320.

One or more elements of one or more of the structures 101, 201, 301, 401, 501, 601, 701, 801, 901, 1001, 1101, 1201 may be incorporated into the structure 1301 of FIGS. 13-1 and 13-2 and vice versa. For example, the structure 1301 may be incorporated into the embodiment of a wearable device 200 shown in FIG. 2.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A structure comprising:
a substrate having a base surface with a plurality of protrusions extending from the base surface or a plurality of depressions extending into the base surface; and
a molded liner, the molded liner encapsulating at least a portion of the plurality of protrusions or extending into at least a portion of the plurality of depressions; and
an electronic component connected to the molded liner.

2. The structure of claim 1, wherein the molded liner is adhesively bonded to at least a portion of the substrate.

3. The structure of claim 1, wherein the plurality of protrusions or the plurality of depressions have a cross-sectional dimension that is less than 40 micrometers.

4. The structure of claim 1, wherein the molded liner includes one or more attachment features.

5. The structure of claim 4, wherein the one or more attachment features include apertures into or through the molded liner.

6. An electronic device, comprising:
a substrate having a base surface with a plurality of protrusions extending from the base surface at an angle;
a molded liner, the molded liner encapsulating the plurality of protrusions; and
an electronic component abutting the molded liner.

7. The device of claim 6, wherein one or more of the plurality of protrusions include an undercut.

8. The device of claim 6, wherein the angle relative to the base surface is between 1 and 89 degrees.

9. The device of claim 6, wherein the angle relative to the base surface is between 20 and 70 degrees.

10. The device of claim 6, wherein the plurality of protrusions include secondary protrusions extending from the plurality of protrusions.

11. The device of claim 10, wherein the secondary protrusions include a distal end that extends toward the base surface.

12. The device of claim 10, wherein the secondary protrusions extend away from the plurality of protrusions at an angle.

13. The device of claim 6, wherein a first protrusion of the plurality of protrusions is connected to a second protrusion of the plurality of protrusions.

14. The device of claim 13, wherein a distal end of the first protrusion abuts a distal end of the second protrusion.

15. The device of claim 6, wherein each of the plurality of protrusions is connected to another one or more of the plurality of protrusions.

16. The device of claim 6, wherein the molded liner includes one or more attachment features.

17. An electronic device, comprising:
a substrate having a base surface with a plurality of depressions extending into the base surface at an angle;
a molded liner, the molded liner extending into at least a portion of the plurality of depressions; and
an electronic component abutting the molded liner.

18. The device of claim 17, wherein one or more of the plurality of depressions include an undercut.

19. The device of claim 18, wherein the angle relative to the base surface is between 1 and 89 degrees.

20. The device of claim 18, wherein the angle relative to the base surface is between 20 and 70 degrees.

* * * * *